United States Patent [19]

Chi et al.

[11] Patent Number: 4,819,039

[45] Date of Patent: Apr. 4, 1989

[54] DEVICES AND DEVICE FABRICATION WITH BOROSILICATE GLASS

[75] Inventors: Gou-Chung Chi, New Providence; Shobha Sing, Summit; LeGrand G. Van Uitert, Morris Township, Morris County; George J. Zydzik, Columbia, all of N.J.

[73] Assignee: American Telephone and Telegraph Co. AT&T Laboratories, Murray Hill, N.J.

[21] Appl. No.: 945,016

[22] Filed: Dec. 22, 1986

[51] Int. Cl.[4] .................. H01L 33/00; H04N 9/27; B05D 5/12

[52] U.S. Cl. .................. 357/17; 357/19; 357/30; 357/73; 427/38; 427/42; 437/238

[58] Field of Search .............. 427/35, 42, 93; 501/53, 501/54, 65; 437/238; 357/17, 19, 52, 73, 30 B

[56] References Cited

U.S. PATENT DOCUMENTS

| | | | |
|---|---|---|---|
| 2,106,744 | 2/1938 | Hood et al. | 501/65 |
| 2,221,709 | 11/1940 | Hood et al. | 501/54 |
| 3,054,221 | 2/1962 | Elmer et al. | 501/54 |
| 4,228,446 | 10/1980 | Kramer | 357/31 |
| 4,374,391 | 2/1985 | Camlibel et al. | 501/54 |
| 4,492,717 | 1/1985 | Plishkin et al. | 427/93 |

OTHER PUBLICATIONS

J. Applied Physics, vol. 37, "Dielectric Thin Films through rf Sputtering", by P. D. Davidse and L. I. Maissel, pp. 574-579, (1966).

Primary Examiner—Norman Morgenstern
Assistant Examiner—Margaret Burke
Attorney, Agent, or Firm—Walter G. Nilsen; Oleg E. Alber

[57] ABSTRACT

Semiconductor devices are described which are made by a process involving the use of certain types of glass layers. These glass layers have high silica content, small amounts of boron oxide and optionally small amounts of aluminum oxide. The glass layers are put down by e-beam deposition procedure using a glass target made from restructured glass. Commercial availability of such glass makes the procedure very convenient. Such glass layers are advantageously used as barrier layers in annealing procedures used when semiconductors are doped (e.g., ion implantation in semiconductors) and as encapsulating layers in finished devices.

33 Claims, 4 Drawing Sheets

DEVICES AND DEVICE FABRICATION WITH BOROSILICATE GLASS

TECHNICAL FIELD

The invention is a process for making a semiconductor device in which a certain type of glass is used in the fabrication procedure and devices made by such processes.

BACKGROUND OF THE INVENTION

The fabrication of some semiconductor devices often requires capping layers for surface protection, pattern delineation, or as a barrier in annealing in various doping procedures. Such surface layers are useful during fabrication as well as on completed devices. Requirements for such films differ widely depending on the particular fabrication procedure, material, etc. Usually, adherence, stability (particularly toward moisture), and effectiveness as a diffusion barrier are of principal importance. Also, stability, adherence, etc., at high temperatures are desirable where high temperatures are used during fabrication of the device or on subsequent use of the device. In addition, with some applications and fabrication procedures, it might be advantageous for the protective layer to be at least partially transparent to radiation including radiation in the infrared, visible, ultraviolet, X-ray and gamma ray regions. Also, stress conditions imposed by the glass layer may be critical to the use of various glass layers particularly where heat treatment of semiconducting compounds containing dopants is involved.

Optical devices are becoming of increasing importance principally because of the development of optical communications systems and certain types of display systems. Because of these developments, various optical devices including semiconductor optical devices are becoming increasingly important so that economic and effective techniques for manufacturing such devices are in great demand. Coatings that are suitable for use on optical devices including semiconductor optical devices are highly desirable. Such coatings should be stable, unaffected by ordinary atmosphere substances such as moisture, chemicals, etc., adherent and be able to withstand temperatures used to fabricate the devices or in the use of the devices. In many devices, the coating should also be transparent at various parts of the radiation spectrum. Where the coating is used to encapsulate optical devices, it should be transparent to the part of the radiation spectrum where they operate. Exemplary optical devices are light emitting diodes, lasers and optical detectors. Coatings are often used as diffusion masks or capping layers in annealing procedures and in various other heat-treatment procedures, as well as for passivation. Here, the layers should prevent diffusion of semiconductor material out through the glass layers or diffusion of doping material out through the glass layer. Often, the thermal expansion properties of the glass layer also plays an important role in the heat-treatment procedure.

It should be remarked that the term "optical" is used in a broad sense and is not limited to visible radiation. The term optical radiation refers to any radiation and includes infrared radiation, ultraviolet radiation, X-ray and gamma ray radiation, etc.

In the fabrication of some devices it is advantageous to have protective layers that are transparent to radiation. For example, it might be advantageous to observe the surface under the protective layer during device fabrication or at various steps during device fabrication.

Typical semiconductor optical devices have been described in a variety of references including *Light Emitting Diodes* by A. A. Bergh and P. J. Dean, Clarenden Press, 1976, *Injection Electroluminescent Devices* by C. H. Gooch, John Wiley and Sons, New York, 1973, and *Semiconductors and Semimetals*, edited by R. K. Willardson and A. C. Beer, Academic Press, 1966, Vol. 2, *Physics of III-V Compounds*. Such devices include semiconductor lasers, opto-isolators, light emitting diodes, light detectors, solar cells, etc.

A particularly rapid development has been occurring in the last few years in semiconductor optical devices. Much of this development is related to improving lifetime performance of semiconductor lasers, improving the performance of avalanche photodetectors and related semiconductor optical devices. Other developments are related to the extension of interest toward lower optical frequencies (principally in the infrared region) where some optical systems (i.e., optical communication systems) exhibit superior performance. Also, a greater variety of materials is being considered for these devices so as to improve performance. Often, these materials require surface protection either during fabrication of the device or when the completed device is being used. Also of increasing importance is the fabrication of other (non-optical) III-V semiconductor devices as well as all types of II-VI semiconductor devices. More efficient, cheaper, faster fabrication of these devices is also highly desirable.

Sample preparation of glasses for use as targets in particle bombardment deposition procedures has been described in a number of publications. See, for example, I. Camlibel et al in U.S. Pat. No. 4,374,391, issued Feb. 15, 1983; however, that glass was prepared at temperatures between 1500 and 2000 C. and is not a restructured (or reconstituted) glass.

SUMMARY OF THE INVENTION

The invention is a process for fabricating a semiconductor device in which the procedure includes deposition of a borosilicate glass layer by a particle beam deposition procedure where the borosilicate glass used in the particle beam deposition is a restructured or reconstituted borosilicate glass made by a phase-seperation procedure at a temperature less than 1500 degrees C. Preferably, the preparation should be carried out at a temperature less than 1400 or even 1300 degrees C. The glass preparation procedure involves mixing together $SiO_2$, $B_2O_3$, $Na_2O$ and optionally other oxides (or precursors to oxides), heating to a temperature where the mixture melts, cooling and then exposing the resulting material to a heat treatment to separate the sodium borate phase from the silica-rich phase. The sodium borate phase is separated out from the silica-rich phase typically by leaching wiht an acid such as aqueous HCl. This leaves behind a porous silica-rich glass phase contaning more than 90 weight percent $SiO_2$. Another heat treatment often with the use of pressure may be used to remove pores and produce a fully dense material. Often, $Al_2O_3$ is included in the initial composition along with $SiO_2$, $B_2O_3$ and $Na_2O$ to get better phase separation, reduce sodium content of the final product and improve the properties of the final, silica-rich product. This glass fabrication procedure is highly advantageous because temperatures in excess of 1500 degrees C are not required in the fabrication procedure and such glasses are available commercially (under the trade name VY-COR).

This glass fabrication procedure yields a glass particularly useful for glass layers, in the fabrication of semiconductor devices, especially devices comprising III-V semiconductor compounds. These glass layers are particularly advantageous where heat treatments are used in the fabrication procedure. Such heat treatment procedures are often used as part of an ion implantation procedure to anneal damage caused by the implantation and activate the implanted material. Also included in the invention are devices made in accordance with the inventive process. Such devices have a number of unique features including unique passivating layers, unique doping profile, etc. Such devices exhibit unusually advantageous properties such as low dark current, low damage from ion implantation, etc. Particularly advantageous is the sharp, shallow doping profile which has a number of advantages of various devices including low pinch-off voltage for FETs, etc.

DETAILED DESCRIPTION

Figure 1:
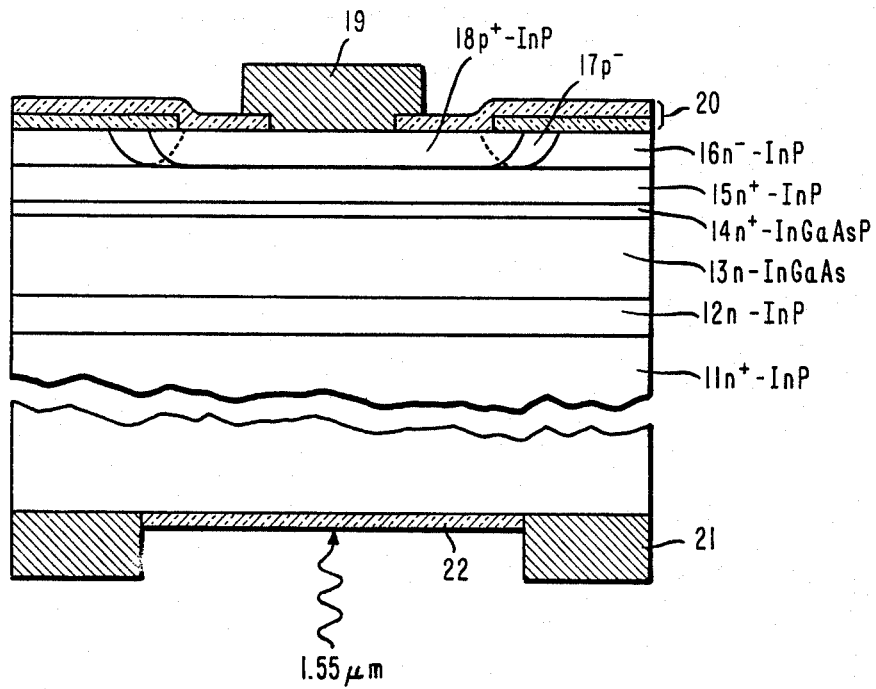
FIG. 1 shows a side view of an avalanche photodiode fabricated advantageously in accordance with the invention.

The invention is based on the discovery that phase-separated, reconstituted glass when deposited by a particle beam deposition procedure (e.g., e-beam deposition) in the form of layers have unusually good properties as a barrier or encapsulating layers during processing or as a passivating layer on devices comprising silicon, III-V semiconductor compounds (e.g., GaAs, InP, etc.) and II-VI semiconductor compounds such as CdTe, HgSe and HgTe. Also of particular interest are III-V compounds which are lattice matched to either InP or GaAs such as InGaAs, InGaAsP, AlInAsP, etc. In these deposition procedures, a boron-containing glass target is made by a specific procedure, and this target is used in the particle deposition procedure. Typical particle deposition procedures are e-beam deposition and sputtering.

The specific procedure involves making a sodium borosilicate glass, effecting phase separation of the sodium borosilicate glass into a sodium-rich phase (e.g., by leaching or other chemical means) to leave a silica-rich phase.

Electron beam disposition is described in a number of references including Physical Vapor Deposition publishing by Airco Temescal (a division of Airco, Inc.), 2850 Seventh Street, Berkeley, Calif. 94710. Sputtering is also described in a number of references including D.D. Davidse and L.I. Maissel in the Journal of Applied Physics, 37, pp. 574–79, 1966. The e-beam procedure is preferred because the surface of the semiconductor on which the glass is being deposited is less likely to be damaged and the deposition process involving e-beam is less likely to involve contamination of the semiconductor surface.

As mentioned above, glass target preparation and composition are of primary importance in the practice of the invention. The glass target has a high silica content, typically greater than 90 weight percent and preferably greater than 95 or even 96 or 97 weight percent. The glass target material also contains boron oxide generally in the concentration range from 1 to 15 weight percent preferably 1–6 weight percent. High silica content is desirable because of chemical stability, purity and the fact that undesirable, detrimental impurities are not introduced into the semiconductor during processing. The presence of boron is also highly desirable probably because it increases the thermal expansion of the glass layer so as to reduce strain of the glass layers in semiconductor surfaces. Also observed with boron present in the glass is much lower diffusion during annealing steps so as to yield more desirable doping profiles.

Small amounts of other substances such as alumina ($Al_2O_3$) also may be present, usually less than one weight percent. Typical compositions are 96–97 weight percent silica, 0.1 to 0.9 weight percent $Al_2O_3$ and 2.0 to 4.0 weight percent $B_2O_3$.

Glass target preparation involves a phase separation procedure which permits the use of much lower temperatures in the glass preparation procedure but still yields the three-dimensional structure necessary to make it useful for the fabrication of a good barrier glass layer.

Initially, a mixture of $Na_2O$, $B_2O_3$ and $SiO_2$ is heated to a temperature between the melting temperature of the mixture and 1500 degrees C (typically 1100–1300 degrees C) for several minutes to several days. Times between 1 and 24 hours are preferred for convenience. Other oxides or precursors to oxides may be added, chiefly $Al_2O_3$, typically in the concentration range from 0.1 and 3.0 weight percent to promote better phase separation, improve the properties of the final product and lead to greater removal of sodium from the final product. Typical composition of the initial mixture are 50–70 weight percent $SiO_2$, 10–30 weight percent $Na_2O$, 10–30 weight percent $B_2O_3$ and 0.2–2.5 weight percent other oxide, typically $Al_2O_3$. On cooling, a sodium borosilicate glass is obtained The sodium borosilicate glass may optionally be cast into a certain form (e.g., suitable for an e-beam target) at room temperature. The sodium borosilicate glass is then heat treated to effect phase separation. This heat treatment is typically between 600 and 900 degrees C for one hour to one day. This results in a material body with two coarsely separated phases; the sodium borate glass phase and the silica-rich glass phase.

The sodium borate phase is then separated out from the silica-rich phase by conventional means usually by acid leaching each with an acid such as aqueous HCl. The silica-rich phase remaining after generally has a $SiO_2$ content of 96 weight percent or greater. This material can often be used as is but more often is heat treated typically at about 1000–1200 degrees C for 1 hour to one day to remove pores and densify the material. This procedure is often called consolidating and sometimes involves the application of pressure. Often in the actual operation, a commercial product such as VYCOR (particularly the product numbered 7913) is used as the glass target material in the particle deposition procedure. Indeed, much of the advantage of this procedure is the availability of commercial glasses of the type described above at reasonably low cost.

A variety of procedures involving particle bombardment are used to deposit glass layers on semiconductor surfaces including e-beam deposition and sputtering.

Generally, with sputtering, magnetron sputtering is used and the substrate is located remote from the plasma so as to avoid surface damage. Argon is generally used as the gas in the sputtering operation. The preferred deposition procedure is e-beam deposition. Advantages of this procedure are low contamination level, reasonable deposition rates where the structure of the glass is largely preserved and easy provision to control the temperature of the surface on which the deposition is being made. In addition, the semiconductor surface, upon which the glass is deposited, generally is not damaged or otherwise affected by the e-beam procedure.

The e-beam deposition procedure is conventional. Generally, the surfaces of interest are exposed to an aqueous HF solution for a short time (e.g., about 30 seconds), rinsed in deionized water and dried before deposition. The temperature of the surface is between room temperature and 350 degrees C with 250–300 preferred. Typical e-beam evaporator pressures are less than or equal to $5 \times 10^{-6}$ torr. The thickness of the glass films may vary over large limits including from about 50 to 5000 Angstroms, but for many applications (annealing ion implanted samples) from 300–1500 Angstroms yield excellent results. For less than 300 Angstroms, the anneal procedure sometimes yields undesirable results. Thicker films yield perfectly good results but are often wasteful of time and material. A particularly good application of the reconstituted glass is in the activation step in an ion-implant process. Here, dopant ions are ion implanted into semiconductor compounds. The sample is annealed or heat treated to remove damage caused by the ion implantation and to activate the dopant ions. The glass is used as the capping layer in the heat treatment. Ion implantation may be carried out before deposition of the glass layer or through the glass layer after deposition of the glass layer. These glass layers may also be used as encapsulants or protective layers permanently attached to the surface of the device.

A large variety of ions can be used in the ion implantation process. These ions include both n-type (donor) ions and p-type (acceptor) ions. Typical examples of donor ions for III–V compounds are silicon, germanium, tin, sulfur, selenium and tellurium. Typical examples of acceptor ions for III–V compounds are zinc, cadmium, mercury, beryllium, magnesium and manganese. For silicon or silicon-germanium alloys, typical n-type dopants are phosphorus and arsenic; a typical p-type dopant is boron.

FIG. 1 shows a planar InP/InGaAs-APD (avalanche photodetector) structure made in accordance with the invention. The photodetector 10 is made up of a substrate 11 (doping level approximately $5 \times 10^{17}$ sulfur atoms/cm$^3$) with a number of epitaxial layers generally put down by vapor phase epitaxy. Immediately above the substrate 11 is an nInP layer 12 (doping level approximately $1–2 \times 10^{16}$ sulfur atoms/cm$^3$) followed by the absorption layer 13 (n-type InGaAs with composition lattice matched to InP and undoped but carrier concentration between $1–10 \times 10^{14}$ per cm$^3$) and then a thin layer 14 of n-InGaAsP with lower bandgap than InGaAs to speed up the response of the device. Next comes an n+-InP layer 15, often called the multiplication layer made up of sulfur doped indium phosphide in the concentration range of $1–2 \times 10^{16}$ atoms/cm$^3$ and then a layer 16 of n-InP (undoped indium phosphide with carrier concentration about $1–10 \times 10^{14}$ carriers/cm$^3$. Guard rings 17 are put down in this layer using ion implantation and the restructured (reconstituted) glass described above. Glass layers deposited by e-beam deposition are used in this deposition to prevent out diffusion during annealing in the ion impregnation-annealing procedure.

It also maintains the integrity of the surface during annealing and minimizes diffusion of the dopant ions during annealing. Typically, a glass layer 23 is deposited over the entire n-InP layer, beryllium is implanted through the glass layer and into the n-InP layer 16 to form the guard rings 17 and the layer is exposed to rapid thermal anneal (typically 800–850 degrees C for 5–15 seconds) or conventional anneal (typically 700–750 degrees C for 5 to 15 minutes). An alternate procedure includes deposition of a glass layer 26 in accordance with the invention on the back face of the substrate 11 prior to rapid thermal anneal and then removed of this glass layer prior to further processing on this back face. The diode part 18 of the nInP layer (the p+-InP in layer 16) may be made by diffusion of cadmium or zinc through a hole opened in the glass layer 23 or ion impregnation through the glass layer followed by rapid thermal anneal. The electrode 19 is generally gold over chromium. The dielectric layer 20 may be silicon nitride or preferably restructured reconstituted glass originally put down for the ion implantation procedure. Where both diode region 18 and guard ring region 17 are done by ion implantation, a single annealing step (e.g., rapid thermal anneal) may be used for both regions. Electrodes 21 are also put on the bottom of the device as well as an antireflection coating 22 (e.g., silicon nitride) where the radiation enters.

With regard to the procedure described above, the glass layer is put down by conventional e-beam procedure, the glass layer thickness is generally about 1000 to 2000 Angstroms and the surface temperature of the semiconductor surface on which the glass is deposited is from 200 to 300 degrees C.

Figure 2:
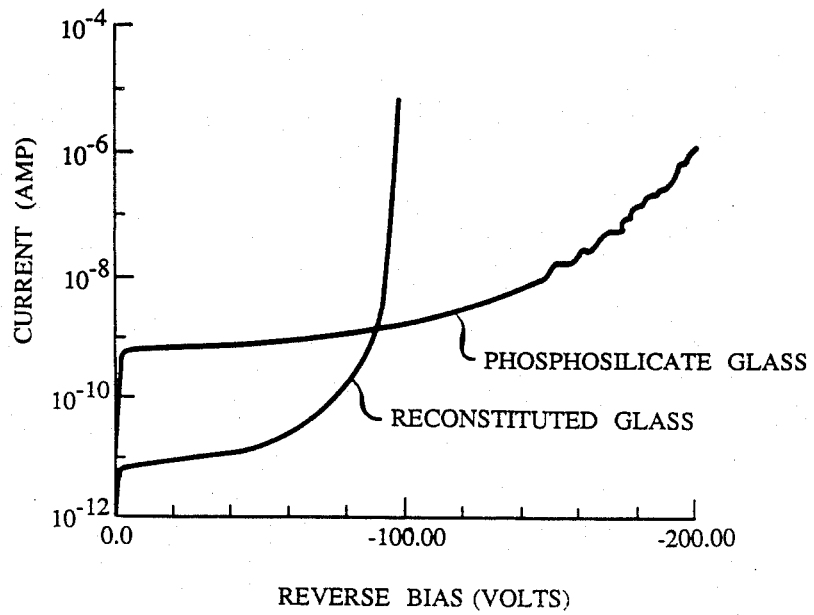
FIG. 2 shows the dark current of a photodiode, one made with reconstituted glass in accordance with the invention; the other with phosphosilicate glass.

Avalanche photodetectors made in accordance with the invention have unusually good characteristics, especially as to low dark current. Low dark current is advantageous because dark current is a source of noise. FIG. 2 shows a plot of dark current vs. reverse bias voltage for photodetectors made by using restructured (reconstituted) glass layers and ones made by use of phosphosilicate glass. As can be seen from the graphs, there is a factor of at least 10 improvement in the dark current at low bias voltage for the device made in accordance with the invention. Such an improvement has a significant effect on device performance, noise characteristics and response time. In addition, improved device performance has considerable economic repercussions in optical communication system design including greater spacing between repeaters, lower error rates, higher data transmission rates, etc.

A number of experiments were carried out using GaAs substrates. The GaAs substrates used in our study were liquid encapsulated Czochralski (LEC) grown, undoped (100) GaAs-wafers of 5 cm diameter. The procedure was carried out on polished wafers of GaAs. A chemicalmechanical polishing procedure using bromine-methanol was used to remove about 50 μm of the surface of the wafers. The wafers were then degreased in boiling trichlorethylene, acetone and methanol and rinsed in deionized water. Finally, they were etched for 3 minutes in a freshly prepared solution of $5H_2SO_4:1-H_2O$ at 70 degrees C, followed by a thorough rinse in deionized water and dried with filtered dry nitrogen.

A Veeco MPH-400 implanter equipped with a hot filament source, which provides high beam resolution, was used to implant $^{29}Si^+$ ions with doses of about $3 \times 10^{12}$ cm$^{-2}$ at an energy of about 60 keV.

All implanted samples were dipped for ~30 seconds in 1HF:1H$_2$O solution, rinsed in deionized water and dried in filtered nitrogen prior to the dielectric deposition. Films of reconstituted glass with thickness of about 1000 Å were deposited in an e-beam evaporator equipped with two 1 kW tungsten lamps for radiative heating of the wafers. Deposition of films was performed in a pressure of ~$5 \times 10^{-6}$ torr.

The glass target for the e-beam deposition is obtained by the phase separation procedure described above. Often, the glass target is obtained as a commercial product such as VYCOR (particularly the product numbered 7913) is used as the glass target material in the particle deposition procedure.

A rapid thermal anneal procedure was used as a post implant anneal procedure. This procedure is carried out in the e-beam evaporation apparatus using tungsten lamps as heat sources. Typical rapid thermal anneal procedures involve temperatures of 900 to 1000 degrees C for 3-10 seconds.

The films were easily removed in either a 1HF:1H$_2$O solution for about 2 minutes or in a CF$_4$ plasma etcher for about 10 minutes. No peeling-off or blistering of films was observed after annealing up to temperatures in excess of 950 degrees C. Films stored for more than six months did not deteriorate with regard to their ability as effective encapsulants.

Carrier concentrations versus depth profiles were determined by the C-V profiling method at the frequency of 10 kHz. The C-V measurements were carried out using a mercury probe to form Schottky barrier contacts. The average mobility was obtained by Hall-effect measurements using the Van der Pauw technique.

Figure 3:
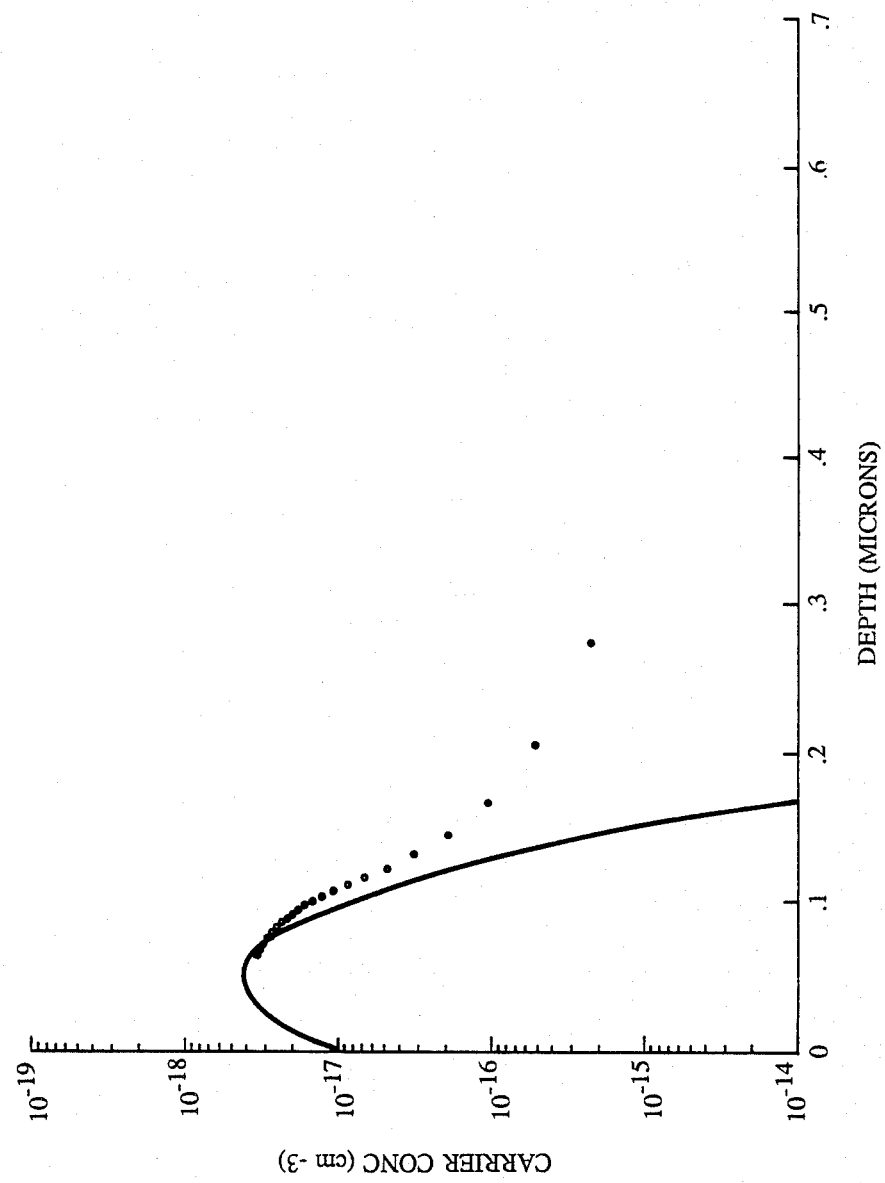
FIG. 3 shows a doping profile for Si implanted GaAs in the form of a graph of doping concentration vs. depth from the surface for glass deposition onto a substrate that is at room temperature.
Figure 4:
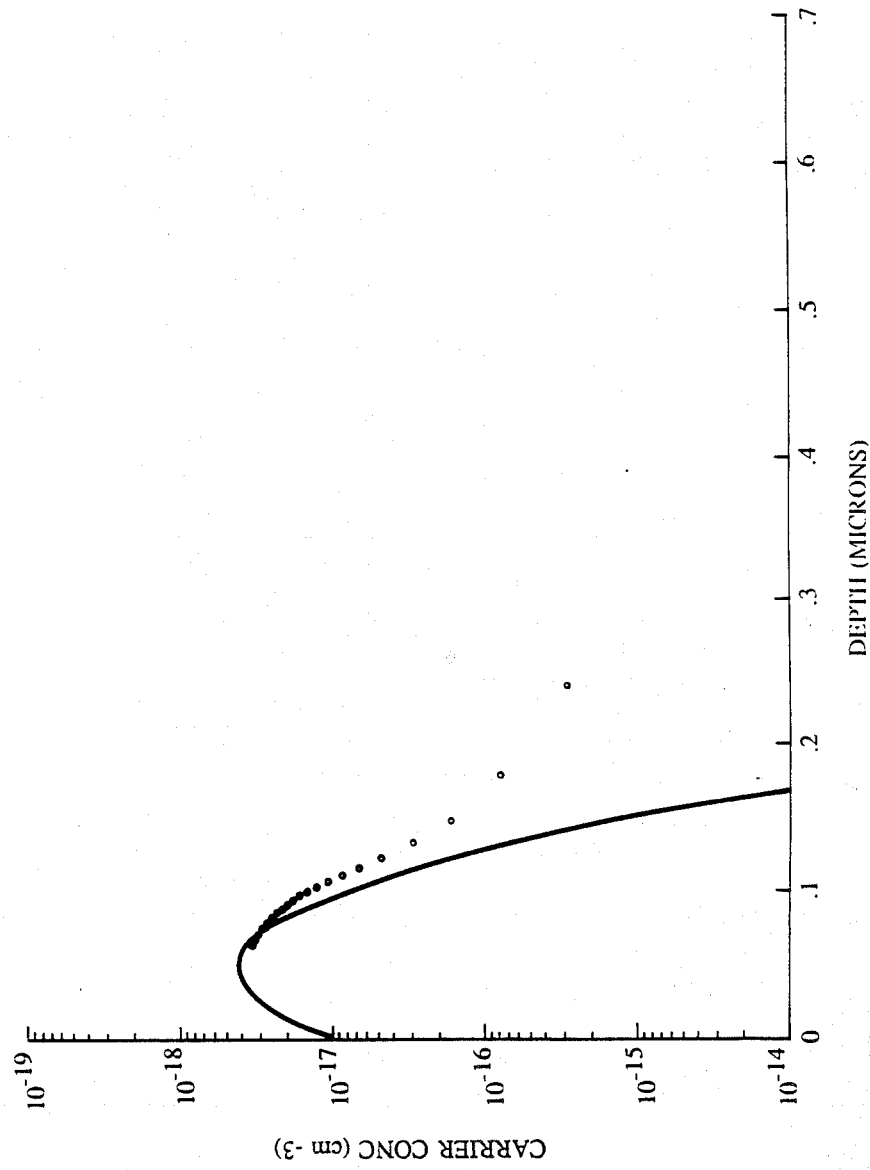
FIG. 4 shows a doping profile for Si implanted GaAs where glass deposition is onto a substrate that is heated to about 230 degrees C.
Figure 5:
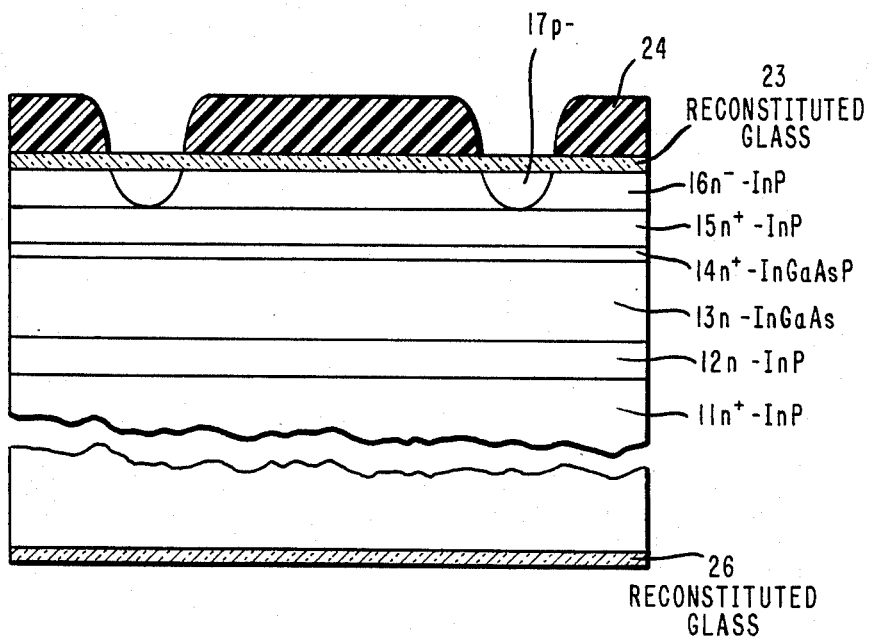
FIG. 5 shows a side view of an in-processing avalanche photodiode with an encapsulating reconstituting glass layer overlayed with suitably patterned photoresist layer, as well as with an optional encapsulating reconstituted glass layer, prior to thermal annealing treatment.

FIG. 3 and FIG. 4 show doping profiles of two GaAs samples implanted and annealed as described above. In FIG. 3, the rapid thermal anneal following implantation was at about 955 degrees C for 6 seconds and the glass was deposited at room temperature. In, the rapid thermal anneal following implantation was at about 955 degrees C for 6 seconds and the glass was deposited at room temperature. In FIG. 4, the rapid thermal anneal was carried out under about the same conditions (990 degrees C for 5 seconds) and the glass layer deposited at 230 degrees C.

What is claimed is:

1. A process for fabricating a semiconductor device comprising III-V semiconductor body and having low dark current characteristics, which comprises the steps of
    depositing a glass target material on at least a part of a surface of said semiconductor body by a particle beam procedure to form a glass material region contacting the said at least a part of the surface, in which the glass material is a reconstituted borosilicate glass comprising at least one weight percent B$_2$O$_3$ and at least 90 weight percent SiO$_2$,
    ion-implanting at least one suitable dopant into at least one preselected region of the said III-V semiconductor surface, said ionimplanting being conducted before or after the glass material deposition step,
    subjecting the said body including the said glass region to a thermal anneal, and
    completing the fabrication of the device,
    wherein the glass target material is prepared at a temperature less than 1500° C. by a procedure comprising the steps of:
    a. making a sodium borosilicate glass comprising sodium borosilicate;
    b. effecting phase separation of the sodium borosilicate glass into a sodium-rich phase and a silica-rich phase;
    c. separating the sodium-rich phase from the silica-rich phase; and
    d. consolidating the silica-rich phase.

2. The method according to claim 1 in which a layer of the reconstituted glass material is deposited prior to said thermal anneal on that surface of said semiconductor body which is opposite to said firstmentioned surface.

3. The process of claim 1 in which the said thermal anneal is a rapid thermal anneal.

4. The process of claim 3 in which the rapid thermal anneal is conducted at temperatures ranging from 800 to 850 degrees C for a period of from 5 to 15 seconds.

5. The process of claim 1 in which the thermal anneal is conducted at temperatures ranging from 700 to 750 degrees C for a period of from 5 to 15 minutes.

6. The process of claim 1 in which said dopant is beryllium.

7. The process of claim 1 in which a hole is made in the said glass region, another suitable dopant is implanted into the said surface through the hole, and the semiconductor body is subjected to the thermal anneal to simultaneously diffuse the ions implanted at both of said implantation steps into the respective regions of the semiconductor body.

8. The process of claim 7 in which said another dopant is selected from the group consisting of cadmium and zinc.

9. The process of claim 1 in which the particle beam procedure is e-beam deposition.

10. The process of claim 1 in which the III-V semiconductor compound is selected from the group consisting of InP and GaAs and compounds lattice matched to InP and GaAs.

11. The process of claim 1 in which the glass material region comprises at least 95 weight percent silica and 1-5 weight percent boron oxide.

12. The process of claim 11 in which the glass material region consists essentially of 96-97 weight percent silica, 0.1 to 0.9 weight percent Al$_2$O$_3$ and 2.0 to 4.0 weight percent B$_2$O$_3$.

13. The process of claim 1 in which the sodium borosilicate glass comprising sodium borosilicate is made by heating a mixture comprising Na$_2$O, B$_2$O$_3$ and SiO$_2$ to a temperature between the fusion temperature of the mixture and 1500 degrees C.

14. The process of claim 13 in which the mixture is heated in step (a) to a temperature between 1100 and 1300 degrees C.

15. The process of claim 13 in which the mixture comprises in addition to $Na_2O$, $B_2O_3$ and $SiO_2$, between 0.1 and 3.0 weight percent 16. The process of claim 13 in which the mixture consists essentially of 50–70 weight percent $SiO_2$, 10–30 weight percent $Na_2O$, 10–30 weight percent $B_2O_3$ and 0.2–2.5 weight percent $Al_2O_3$.

17. The process of claim 1 in which phase separation is effected by heat treatment in the temperature range from 600 to 900 degrees C.

18. The process of claim 1 in which the sodium-rich phase is separated from the silica-rich phase by acid leaching.

19. The process of claim 18 in which acid leaching is carried out with aqueous HCl.

20. The process of claim 1 wherein said ion-implantation step is preferably accomplished after said glass material deposition step.

21. The process of claim 1 wherein said ion-implantation step is accomplished prior to said glass material deposition step.

22. A device having low dark current characteristics made by the process comprising the steps of
    depositing a glass target material on at least a part of a surface of a III–V semiconductor body by a particle beam procedure to form a glass material region contacting the said at least a part of the surface, in which the glass material is a reconstituted borosilicate glass comprising at least one weight percent $B_2O_3$ and at least 90 weight percent $SiO_2$,
    ion-implanting at least one suitable dopant into at least one preselected region of the said III–V semiconductor surface, said ionimplanting being conducted before or after said glass material deposition step,
    subjecting the said semiconductor body including the implanted region to a thermal anneal, and
    completing the fabrication of the device,
    wherein the glass target material is prepared at a temperature less than 1500° C. by a procedure comprising the steps of:
    a. making a sodium borosilicate glass comprising sodium borosilicate;
    b effecting phase separation of the sodium borosilicate glass into a sodium-rich phase and a silica-rich phase;
    c. separating the sodium-rich phase from the silica-rich phase; and
    d. consolidating the silica-rich phase.

23. The device of claim 22 in which a layer of said reconstituted borosilicate glass material is deposited prior to said thermal anneal on that surface of said semiconductor body which is opposite to said first-mentioned surface.

24. The process of claim 22 in which the said thermal anneal is a rapid thermal anneal.

25. The process of claim 24 in which the rapid thermal anneal is conducted at temperatures ranging from 800 to 850 degrees C for a period of from 5 to 15 seconds.

26. The process of claim 22 in which the thermal anneal is conducted at temperatures ranging from 700 to 750 degrees C for a period of from 5 to 15 minutes.

27. The process of claim 22 in which said dopant is beryllium.

28. The process of claim 22 in which a hole is made in the said glass region, another suitable dopant is implanted into the said surface through the hole, and the semiconductor body is subjected to the thermal anneal to simultaneously diffuse the ions implanted at both of said implantation steps into the respective regions of the semiconductor body.

29. The process of claim 28 in which said another dopant is selected from the group consisting of cadmium and zinc.

30. The process of claim 22 wherein said ion-implantation step is preferably accomplished after said glass material deposition step.

31. The process of claim 22 wherein said ion-implantation step is accomplished prior to said glass materail deposition step.

32. The device of claim 22 in which the device is an avalanche photodiode.

33. The device of claim 22 in which the device is a GaAs integrated circuit

* * * * *